US012196893B2

(12) United States Patent
Wang

(10) Patent No.: US 12,196,893 B2
(45) Date of Patent: Jan. 14, 2025

(54) X-RAY DEVICE AND SENSING PANEL

(71) Applicant: InnoCare Optoelectronics Corporation, Tainan (TW)

(72) Inventor: Zhi-Hong Wang, Tainan (TW)

(73) Assignee: InnoCare Optoelectronics Corporation, Tainan (TW)

( * ) Notice: Subject to any disclaimer, the term of this patent is extended or adjusted under 35 U.S.C. 154(b) by 450 days.

(21) Appl. No.: 17/564,156

(22) Filed: Dec. 28, 2021

(65) Prior Publication Data

US 2022/0236427 A1 Jul. 28, 2022

(30) Foreign Application Priority Data

Jan. 28, 2021 (CN) ........................ 202110118641.7

(51) Int. Cl.
*G01T 1/20* (2006.01)
*G01T 1/208* (2006.01)
*H01L 27/146* (2006.01)

(52) U.S. Cl.
CPC .......... *G01T 1/20184* (2020.05); *G01T 1/208* (2013.01); *H01L 27/14612* (2013.01); *H01L 27/14663* (2013.01)

(58) Field of Classification Search
CPC ................. G01T 1/20184; G01T 1/208; H01L 27/14612; H01L 27/14663
See application file for complete search history.

(56) References Cited

U.S. PATENT DOCUMENTS

2015/0123119 A1* 5/2015 Sekine ............. H01L 27/14685 257/43
2016/0037106 A1 2/2016 Ohmaru
2021/0199817 A1* 7/2021 Yun .................. H01L 27/14683

FOREIGN PATENT DOCUMENTS

CN 102628953 8/2012
CN 109585594 4/2019

* cited by examiner

*Primary Examiner* — Matthew L Reames
(74) *Attorney, Agent, or Firm* — JCIPRNET

(57) ABSTRACT

An X-ray device including a sensing panel and a scintillator layer is provided. The sensing panel includes a substrate and a first pixel. The first pixel is disposed on the substrate and includes a first light sensing component and a first switch component. The first switch component is disposed on the first light sensing component. The scintillator layer is disposed on the sensing panel, and the first switch component is disposed between the scintillator layer and the first light sensing component.

20 Claims, 5 Drawing Sheets

X-RAY DEVICE AND SENSING PANEL

CROSS-REFERENCE TO RELATED APPLICATION

This application claims the priority benefit of China patent application serial no. 202110118641.7, filed on Jan. 28, 2021. The entirety of the above-mentioned patent application is hereby incorporated by reference herein and made a part of this specification.

BACKGROUND

Technical Field

The disclosure relates to an electronic device and a panel, and in particular, to an X-ray device and a sensing panel.

Description of Related Art

The image quality of the X-ray device is related to the current leakage of the light sensing component. In general, it is more favorable for a light sensing component to exhibit less current leakage. In the current practice, the light sensing component is disposed on the substrate, that is, the substrate is used to provide a smooth installation surface to reduce leakage current caused by an uneven surface. Nevertheless, since the light sensing component and the switch component are disposed to be adjacent to each other without overlapping with each other, the fill factor (FF) of the light sensing component is reduced, and that the area of the photoelectric conversion layer of the light sensing component may not be effectively increased.

SUMMARY

The disclosure provides an X-ray device capable of improving current leakage or a fill factor.

According to an embodiment of the disclosure, an X-ray device includes a sensing panel and a scintillator layer. The sensing panel includes a substrate and a first pixel. The first pixel is disposed on the substrate and includes a first light sensing component and a first switch component. The first switch component is disposed on the first light sensing component. The scintillator layer is disposed on the sensing panel, and the first switch component is disposed between the scintillator layer and the first light sensing component.

According to an embodiment of the disclosure, a sensing panel suitable for an X-ray device includes a substrate and a first pixel. The first pixel is disposed on the substrate and includes a first light sensing component and a first switch component. The first light sensing component includes a first bottom electrode, a first photoelectric conversion layer, and a first top electrode. The first bottom electrode is disposed on the substrate. The first photoelectric conversion layer is disposed on the first bottom electrode. The first top electrode is disposed on the first photoelectric conversion layer. The first switch component is disposed on the first light sensing component, and the first light sensing component is disposed between the first switch component and the substrate. The first bottom electrode includes a metal electrode. The first top electrode includes a transparent electrode.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
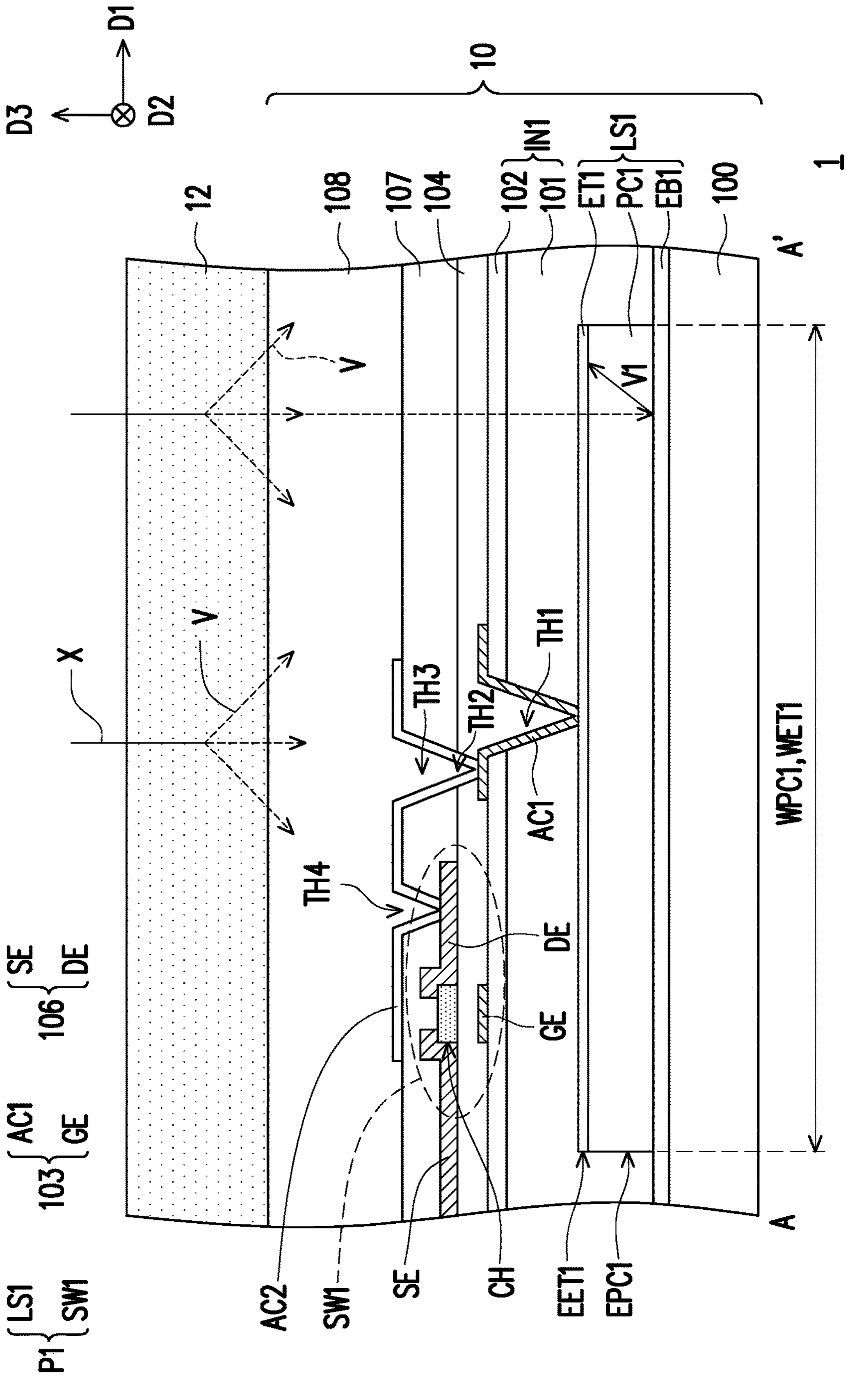
FIG. 1 is a schematic cross-sectional view of a local portion of an X-ray device according to a first embodiment of the disclosure.

The accompanying drawings are included together with the detailed description provided below to provide a further understanding of the disclosure. Note that in order to make the accompanying drawings to be more comprehensible to readers and for the sake of clarity of the accompanying drawings, only part of the electronic device/display is depicted in the accompanying drawings of the disclosure, and specific components in the drawings are not depicted according to actual scales. In addition, the numbers and sizes of the components in each drawing are provided for illustration only and are not used to limit the scope of the disclosure. For instance, the relative size, thickness, and location of each film layer, region, or structure may be reduced or enlarged for clarity.

Throughout the specification and appended claims of the disclosure, certain terms are used to refer to specific components. A person of ordinary skill in the art should understand that electronic apparatus manufacturers may refer to the same components by different names. In the specification, it is not intended to distinguish between components that have the same function but different names. In the following specification and claims, the words "containing" and "including" are open-ended words and therefore should be interpreted as "containing but not limited to . . . ".

In the following embodiments, wording used to indicate directions, such as "up", "down", "front", "back", "left", and "right" merely refers to directions in the accompanying figures. Therefore, the directional wording is used to illustrate rather than limit the disclosure. It should be understood that when a component or a film layer is referred to as being disposed "on" or "connected to" another component or film layer, the component or the film layer can be directly on the another component or film layer or be directly connected to the another component or film layer, or an inserted component or film layer may be provided therebetween (not a direct connection). In contrast, when the component or the film layer is referred to as being "directly on" another component or film layer or "directly connected to" another component or film layer, an inserted component or film layer is not provided therebetween.

The terms mentioned in the specification such as "about", "equal to", "identical" or "same", "substantially", or "approximately" generally represents a range falling within 10% of a given value or range or represents a range falling within 5%, 3%, 2%, 1%, or 0.5% of a given value or range. In addition, the wordings "the given range is from the first numerical value to the second numerical value" and "the given range falls within the range of the first numerical value to the second numerical value" mean that the given range includes the first numerical value, the second numerical value, and other numerical values therebetween.

In some embodiments of the disclosure, regarding the words such as "connected", "interconnected", etc. referring to bonding and connection, unless specifically defined, these words mean that two structures are in direct contact or two structures are not in direct contact, and other structures are provided to be disposed between the two structures. The word for bonding and connecting may also include the case where both structures are movable or both structures are fixed. In addition, the wordings "electrically connected" and "coupled" may include any direct or indirect electrical connection means.

The same or similar reference numerals represent the same or similar components in the following exemplary embodiments, and repeated description thereof is thus omitted. In addition, the features of the embodiments may be mixed and matched arbitrarily as long as they do not violate or do not conflict with the spirit of the disclosure, and simple equivalent changes and modifications made according to the specification or claims are still within the scope of the disclosure. Words such as "first" and "second" in the specification or claims are used only to name different components or to distinguish different embodiments or scopes and should not be construed as the upper limit or lower limit of the number of any components and should not be construed to limit a manufacturing order or an arrangement order of the components.

Figure 2:
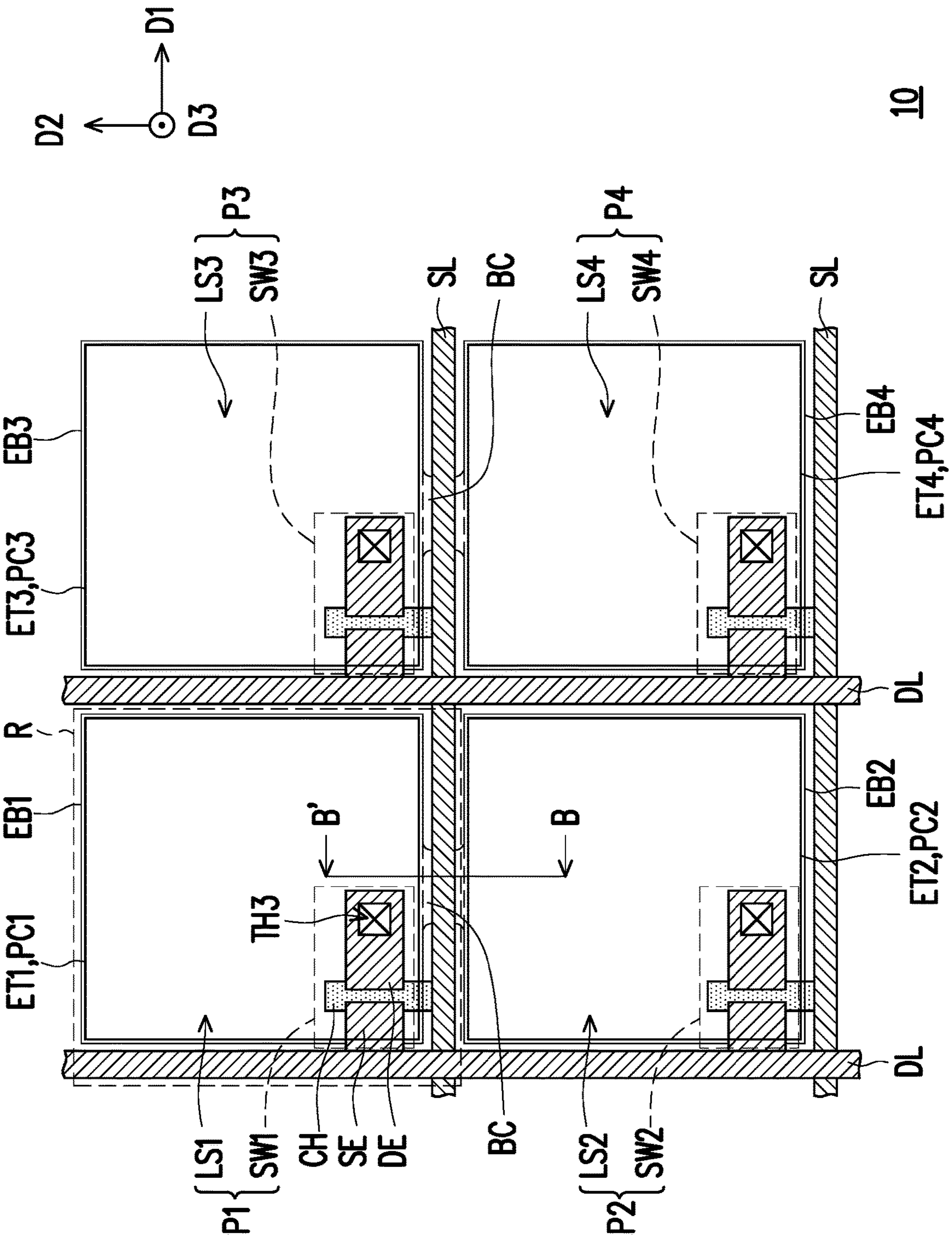
FIG. 2 is a schematic top view of the local portion of the X-ray device according to the first embodiment of the disclosure.
Figure 3:
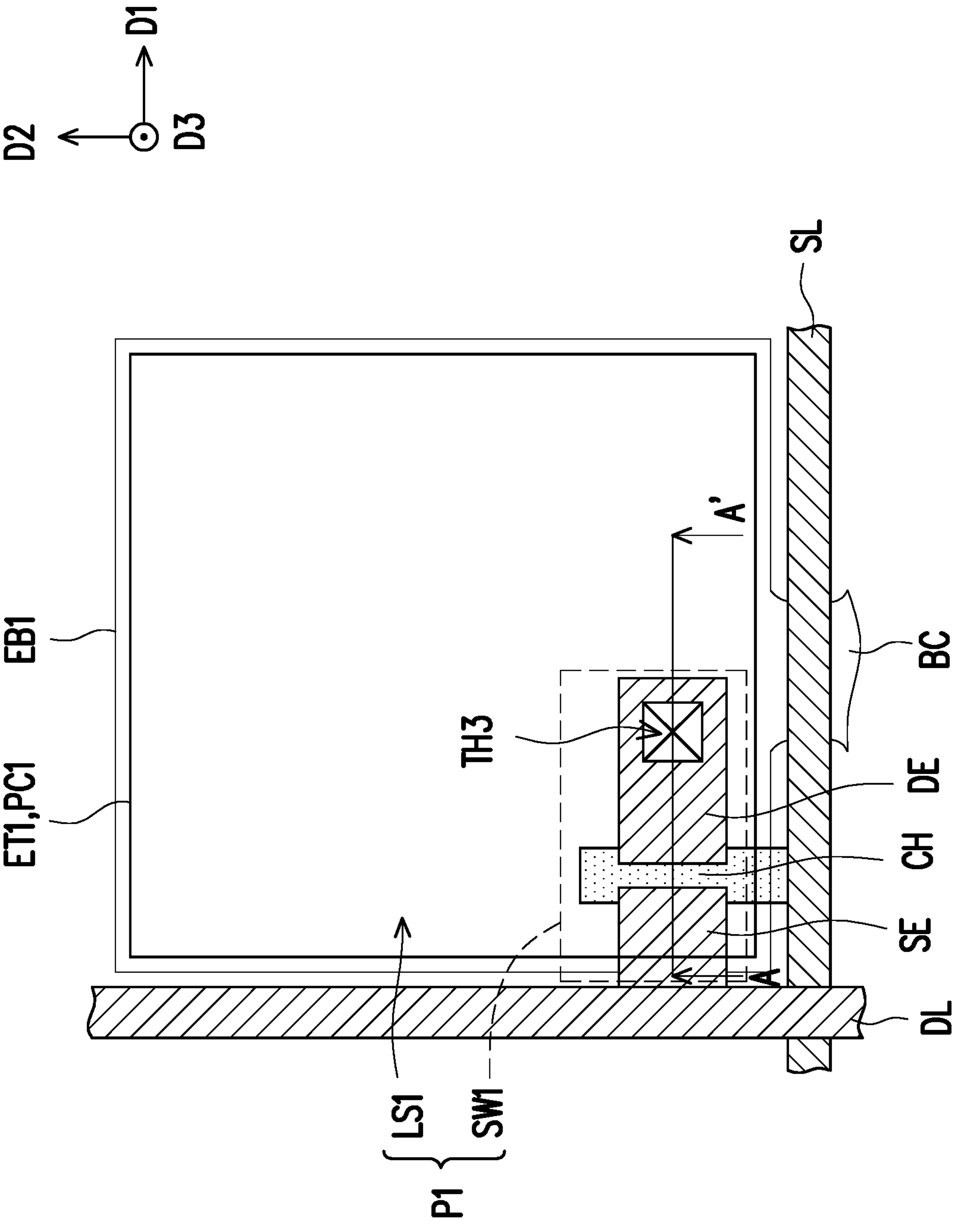
FIG. 3 is a schematic enlarged view of a region R in FIG. 2.
Figure 4:
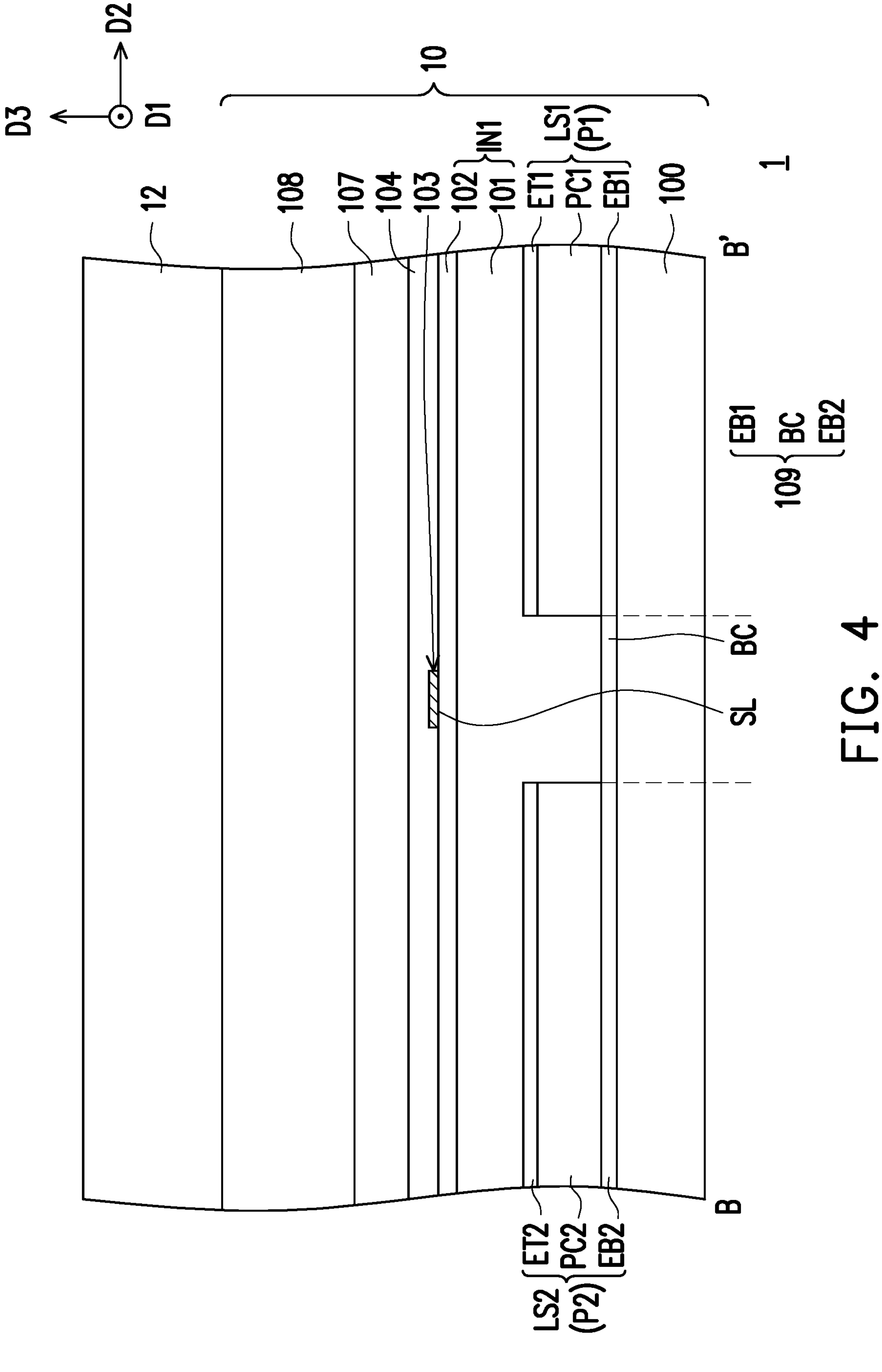
FIG. 4 is a schematic cross-sectional view of a sectional line B-B' in FIG. 2.

FIG. 1 is a schematic cross-sectional view of a local portion of an X-ray device 1 according to a first embodiment of the disclosure. FIG. 2 is a schematic top view of the local portion of the X-ray device 1 according to the first embodiment of the disclosure. FIG. 3 is a schematic enlarged view of a region R in FIG. 2. FIG. 4 is a schematic cross-sectional view of a sectional line B-B' in FIG. 2. A cross-section of a sensing panel 10 in FIG. 1 corresponds to, for example, the cross-sectional line A-A' in FIG. 3. Some components in the X-ray device 1 are omitted in FIG. 2 in order to clearly show relative arrangement relationships among other components. The relative arrangement relationships between these components and other components omitted in FIG. 2 may be found with reference to FIG. 1 or FIG. 4.

With reference to FIG. 1, the X-ray device 1 may include a sensing panel 10 and a scintillator layer 12. The scintillator layer 12 is suitable for converting an X ray incident to the X-ray device 1 into visible light V. For instance, a material of the scintillator layer 12 may include, but not limited to, caesium iodide (CsI). In other embodiments, the material of the scintillator layer 12 may include inorganic scintillators or organic scintillators of other types.

The sensing panel 10 is suitable for receiving the visible light V and generating a corresponding electric signal. For instance, the sensing panel 10 may include a substrate 100 and a first pixel P1. According to different needs, the substrate 100 may be a rigid substrate or a flexible substrate. A material of the substrate 100 includes, but not limited to, glass, quartz, ceramic, sapphire, or plastic, etc., for example. In some embodiments, the substrate 100 may be a flexible substrate, and the material of the substrate 100 may include, but not limited to, polycarbonate (PC), polyimide (PI), polypropylene (PP), polyethylene terephthalate (PET), other suitable flexible materials, or a combination of the foregoing. In addition, transmittance of the substrate 100 is not limited, that is, the substrate 100 may be a transparent substrate, a semi-transparent substrate, or a non-transparent substrate.

The first pixel P1 is disposed on the substrate 100 and includes a first light sensing component LS1 and a first switch component SW1. Taking a photodiode as an example, the first light sensing component LS1 may include a first bottom electrode EB1, a first photoelectric conversion layer PC1, and a first top electrode ET1.

The first bottom electrode EB1 is disposed on the substrate 100. In some embodiments, the first bottom electrode EB1 is disposed between the first photoelectric conversion layer PC1 and the substrate 100. In other words, the first bottom electrode EB1 is located on one side of the first photoelectric conversion layer PC1 away from the scintillator layer 12. In this way, a chance of receiving the visible light V converted through the scintillator layer 12 by the first photoelectric conversion layer PC1 is increased. A material of the first bottom electrode EB1 may be a transparent conductive material or a non-transparent conductive material. For instance, the material of the first bottom electrode EB1 may include, but not limited to, metal oxide (e.g., indium tin oxide (ITO)), metal, alloy, or a combination of at least two of the above. When the material of the first bottom electrode EB1 includes a non-transparent conductive material, for instance, when the first bottom electrode EB1 includes a metal electrode, the first bottom electrode EB1 may reflect the visible light V transmitted towards the substrate 100, such as visible light V1, and absorption of the visible light V performed by the first photoelectric conversion layer PC1 may thus be increased.

The first photoelectric conversion layer PC1 is disposed on the first bottom electrode EB1, and the first photoelectric conversion layer PC1 is suitable for receiving the visible light V and generating a corresponding electric signal. For instance, the first photoelectric conversion layer PC1 may include a stack layer of a P-type semiconductor layer and a N-type semiconductor. In some embodiments, the first photoelectric conversion layer PC1 may further include an intrinsic semiconductor layer or a low-doped P-type semiconductor layer, and the intrinsic semiconductor layer or the low-doped P-type semiconductor layer may be disposed between the P-type semiconductor layer and the N-type semiconductor layer.

The first top electrode ET1 is disposed on the first photoelectric conversion layer PC1. The first top electrode ET1 is disposed corresponding to the first bottom electrode EB1, meaning that the first top electrode ET1 at least partially overlaps with the first bottom electrode EB1 in a normal direction (e.g., a third direction D3) of the substrate 100. In some embodiments, the first photoelectric conversion layer PC1 contacts the first top electrode ET1 and the first bottom electrode EB1. In some other embodiments, the first top electrode ET1 and the first bottom electrode EB1 are suitable for providing a negative bias voltage for the first photoelectric conversion layer PC1. To be specific, according to design needs, the first top electrode ET1 and the first bottom electrode EB1 may both be negatively biased, may both be positively biased, or one may be positively biased and the other one is negatively biased. For instance, the first top electrode ET1 is positively biased, the first bottom electrode EB1 is negatively biased, but is not limited thereto, as long as a total voltage provided by the two for the first photoelectric conversion layer PC1 is a negative bias voltage.

In some embodiments, the first top electrode ET1 is disposed between the first photoelectric conversion layer PC1 and the scintillator layer 12. In other words, the first top electrode ET1 is located on one side of the first photoelectric conversion layer PC1 close to the scintillator layer 12. As such, a transparent conductive material may be adopted as a material of the first top electrode ET1 to facilitate absorption of the visible light V for the first photoelectric conversion layer PC1. For instance, the first top electrode ET1 may include, but not limited to, an indium tin oxide electrode, other metal oxide electrodes, other transparent electrodes, or a combination of the foregoing.

In some embodiments, the first top electrode ET1 and the first photoelectric conversion layer PC1 may be formed by patterning a same mask to reduce the total number of masks. In this architecture, an edge EPC1 of the first photoelectric conversion layer PC1 is aligned with, for example, an edge EET1 of the first top electrode ET1. Arrangement of mutual alignment of two edges of two components may include edge alignment or substantial edge alignment of the two components, that is, widths of the two components are equal or are substantially equal. Substantially equal, for example, means that an error value is less than or equal to 5%. The error value may be calculated as follows, for example: a width WPC1 of the first photoelectric conversion layer PC1 in a first direction D1 minus an absolute value of a width WET1 of the first top electrode ET1 in the first direction D1, and a calculated result is then divided by the width WPC1, that is, (WPC1−WET1)/WPC1. In some other embodiments, the edge EPC1 of the first photoelectric conversion layer PC1 may not be aligned with the edge EET1 of the first top electrode ET1.

The sensing panel 10 may include a gate insulating layer 104. The gate insulating layer 104 is disposed on the substrate 100. In some embodiments the gate insulating layer 104 has a second through hole TH2. The first switch component SW1 is disposed on the first light sensing component LS1. Taking a bottom gate thin film transistor as an example, the first switch component SW1 may include a gate GE, a portion of the gate insulating layer 104, a channel layer CH, a source SE, and a drain DE. The gate GE is disposed between the scintillator layer 12 and the first light sensing component LS1. The gate insulating layer 104 is disposed on the gate GE. The channel layer CH is disposed on the gate insulating layer 104 and is located above the gate GE. The source SE and the drain DE are disposed on the gate insulating layer 104.

It should be understood that although FIG. 1 shows the first switch component SW1 in one embodiment of the bottom gate thin film transistor, a structure or a type of the first switch component SW1 is not limited to this. Besides, according to different needs, the number of the switch component in the first pixel 1 may be greater than or equal to one. In addition, the first pixel P1 may include, but is not limited to, other components such as a capacitor or a storage capacitor.

The scintillator layer 12 is disposed on the sensing panel 10, and the first switch component SW1 is disposed between the scintillator layer 12 and the first light sensing component LS1. In other words, the first light sensing component LS1, the first switch component SW1, and the scintillator layer 12 are, for example, disposed on the substrate 100 in sequence. Nevertheless, the disclosure is not limited thereto, and in other embodiments, the first switch component SW1 may also be disposed between the first light sensing component LS1 and the substrate 100.

Through arranging the first switch component SW1 between the scintillator layer 12 and the first light sensing component LS1, the first light sensing component LS1 may be formed on a flat surface (e.g., a surface of the substrate 100), and current leakage may thus be reduced, or an area of the first photoelectric conversion layer PC1 may be increased so that a fill factor of the first light sensing component LS1 (i.e., a ratio of a light sensing area in the first pixel P1 to an area of the first pixel P1) may be accordingly increased. In other words, the area of the photoelectric conversion layer may be increased, and in this way, the number of photon signals received by the photoelectric conversion layer is increased, and the amount of signals received by the light sensing component may thus be increased. Therefore, the signal-to-noise ratio (SNR) may be increased or image quality may be improved. Alternatively, in the case that the same amount of signals are received, X-ray radiation may be reduced. The light sensing area in the first pixel P1 may be observed under a microscope, for example, and may be the area of the first photoelectric conversion layer PC1 minus an area of the first switch component SW1. A light sensing area in the second pixel P24 may also be deduced by analogy, and description thereof is not repeated herein.

In some embodiments, compared to the design in which the switch component and the light sensing component are both disposed on the substrate and the first switch component and the first light sensing component do not overlap with each other in the normal direction of the substrate (e.g., the third direction D3), the design in which the first switch component SW1 is disposed between the scintillator layer 12 and the first light sensing component LS1 may increase the fill factor by, for example, 11%, or may increase a gain by, for example, 17.5%.

As the first light sensing component LS1 is fabricated before the first switch component SW1, in this way, a first reference circuit AC1 and the gate GE of the first switch component SW1 may be formed in a same process, a third through hole TH3 and the second through hole TH2 may be formed in a same process, and compared to the design structure in which the first switch component and the first light sensing component do not overlap with each other in the normal direction of the substrate, at least two masks may be saved through this design. In some embodiments, current leakage detection and/or defect monitoring may be performed after the first light sensing component LS1 is fabricated and before the first switch component SW1 is fabricated.

According to different needs, the sensing panel 10 may further include other components or film layers. For instance, the sensing panel 10 may further include a first insulating layer IN1. The first insulating layer IN1 is disposed on the first light sensing component LS1 and has a first through hole TH1. The first through hole TH1 may expose a portion of the first top electrode ET1. In some embodiments, as shown in FIG. 1, the first insulating layer IN1 may include a stack layer of an organic insulating layer 101 and an inorganic insulating layer 102. Herein, the organic insulating layer 101 is disposed on the first light sensing component LS1 and is located between the inorganic insulating layer 102 and the first light sensing component LS1. Nevertheless, in some other embodiments, the first insulating layer IN1 may include only one of the organic insulating layer 101 and the inorganic insulating layer 102.

The sensing panel 10 may further include the first reference circuit AC1. The first reference circuit AC1 is disposed on the first insulating layer IN1 and is electrically connected to the first top electrode ET1 through the first through hole TH1. In some embodiments, the first reference circuit AC1 and the gate GE of the first switch component SW1 may belong to a same layer. The first reference circuit AC1 and the gate GE belonging to the same layer may refer to that the first reference circuit AC1 and the gate GE are fabricated through the same process or are fabricated by the same material. Taking FIG. 1 as an example, the first reference circuit AC1 and the gate GE both belong to a first conductive layer 103, for example. A material of the first conductive layer 103 may include, but not limited to, metal, an alloy, or a combination of the two. According to some embodiments, the gate insulating layer 104 is disposed on the first reference circuit AC1. The second through hole TH2 of the gate insulating layer 104 exposes a portion of the first reference circuit AC1. In some embodiments, the first reference circuit AC1 and the drain DE of the first switch component SW1 may be electrically connected through the second through hole TH2.

The sensing panel 10 may further include a second insulating layer 107. The second insulating layer 107 is disposed on the gate insulating layer 104 and the first switch component SW1. The second insulating layer 107 may include, but not limited to, an organic insulating layer, an inorganic insulating layer, or a stack layer of the foregoing two. In some embodiments, the second insulating layer 107 has the third through hole TH3 and a fourth through hole TH4. The third through hole TH3 is connected to the second through hole TH2. In other words, in the normal direction of the substrate 100, the third through hole TH3 at least partially overlaps with the second through hole TH2. The fourth through hole TH4 exposes a portion of the drain DE of the first switch component SW1.

The sensing panel 10 may further include a second reference circuit AC2. The second reference circuit AC2 is disposed on the second insulating layer 107 and extends into the second through hole TH2, the third through hole TH3, and the fourth through hole TH4. The first reference circuit AC1 and the drain DE of the first switch component SW1 are electrically connected through the second reference circuit AC2. A material of the second reference circuit AC2 may include, but not limited to, a transparent conductive material. The "electrical connection" provided in the disclosure includes direct electrical connection or indirect electrical connection.

In some embodiments, the sensing panel 10 may further include a third insulating layer 108. The third insulating layer 108 is disposed on the second reference circuit AC2 and the second insulating layer 107, and the scintillator layer 12 is disposed on the third insulating layer 108. For instance, a material of the third insulating layer 108 may include, but not limited to, an inorganic insulating layer or an organic insulating layer. In some other embodiments, the third insulating layer 108 may be omitted in the sensing panel 10. In other embodiments, other layers may be further disposed between the scintillator layer 12 and the third insulating layer 108.

With reference to FIG. 1 and FIG. 2, the sensing panel 10 may further include a plurality of scan lines SL and a plurality of data lines DL. The scan lines SL and the data lines DL are disposed on the substrate 100, and the data lines DL and the scan lines SL are disposed in an alternating manner. For instance, the scan lines SL may extend in a first direction D1 and may be arranged in a second direction D2, and the data lines DL may extend in the second direction D2 and may be arranged in the first direction D1. The first direction D1 and the second direction D2 intersect with each other and are, for example, perpendicular to each other, but are not limited thereto. In some embodiments, the scan lines SL, the gate GE, and the first reference circuit AC1 may belong to the same layer (e.g., the first conductive layer 103). In some embodiments, the data lines DL, the source SE, and the drain DE may belong to the same layer (e.g., a second conductive layer 106).

In addition to the first pixel P1, the sensing panel 10 may further include a second pixel P2. The second pixel P2 is disposed on the substrate 100, and the first pixel P1 and the second pixel P2 are arranged in an extending direction (e.g., the second direction D2) of the data lines DL, for example. The first pixel P1 and the second pixel P2 may be defined through the scan lines SL and the data lines DL. For instance, in FIG. 2, a region enclosed by the intersecting adjacent two scan lines SL and adjacent two data lines DL may be the second pixel P2. The definition of the first pixel P1 is similar to the definition of the second pixel P2, and description thereof may be deduced by analogy.

The second pixel P2 may include a second light sensing component LS2 and a second switch component SW2. As shown in FIG. 4, the second light sensing component LS2 may include a second bottom electrode EB2, a second photoelectric conversion layer PC2, and a second top electrode ET2. The second photoelectric conversion layer PC2 is disposed between the second bottom electrode EB2 and the second top electrode ET2. Description of materials of the second bottom electrode EB2, the second photoelectric conversion layer PC2, and the second top electrode ET2 and relative arrangement relationships with other components may be found with reference to the description of the first bottom electrode EB1, the first photoelectric conversion layer PC1, and the first top electrode ET1, and such description is thus not repeated herein.

With reference to FIG. 2 again, the second switch component SW2 is disposed on the second light sensing component LS2. Description of relative arrangement relationships, materials, etc. of film layers in the second switch component SW2 may be found with reference to FIG. 1 and the description of the first switch component SW1, and such description is thus not repeated herein.

With reference to FIG. 3 and FIG. 4, the sensing panel 10 may further include a bias circuit BC. According to some embodiments, the bias circuit BC, the first bottom electrode EB1, and the second bottom electrode EB2 may be fabricated through the same process or may be fabricated through the same material. Taking FIG. 4 as an example, the bias circuit BC, the first bottom electrode EB1, and the second bottom electrode EB2 all belong to a third conductive layer 109, for example. The third conductive layer 109 is disposed on the substrate 100. According to some embodiments, in the normal direction of the substrate 100, the first bottom electrode EB1 may be a portion where the third conductive layer 109 and the first top electrode ET1 overlap, and the second bottom electrode EB2 may be a portion where the third conductive layer 109 and the second top electrode ET2 overlap. According to some embodiments, the bias circuit BC may be disposed between the first pixel P1 and the second pixel P2. The bias circuit BC may electrically connect the first bottom electrode EB1 of the first light sensing component LS1 and the second bottom electrode EB2 of the second light sensing component LS2. Through the electrical connection among the bias circuit BC, the first bottom electrode EB1, and the second bottom electrode EB2, the bias circuit may thus be prevented from blocking photon absorption performed by the first photoelectric conversion layer PC1 and the second photoelectric conversion layer PC2. In this way, as the photoelectric conversion layers may not be shielded, light sensing areas in the pixels (e.g., the first pixel P1 and the second pixel P2) may be increased, so that the fill factor may be enhanced or the image quality of the X-ray device 1 may be improved. In some embodiments, the conductive layers (e.g., the first top electrode ET1, the second top electrode ET2, the second reference circuit AC2, etc.) disposed on the photoelectric conversion layers may be transparent conductive layers, so that the fill factor may be further enhanced. The transparent conductive layers may be formed by or composed of, but not limited to, a transparent conductive material or a metal mesh electrode layer.

The sensing panel 10 may further include a third pixel P3. The third pixel P3 is disposed on the substrate 100, and the first pixel P1 and the third pixel P3 are arranged in an extending direction (e.g., the first direction D1) of the scan lines SL, for example. The definition of the third pixel P3 is similar to the definition of the second pixel P2, and description thereof may be deduced by analogy.

The third pixel P3 may include a third light sensing component LS3 and a third switch component SW3. The third light sensing component LS3 includes a third bottom electrode EB3, a third photoelectric conversion layer PC3, and a third top electrode ET3. The third photoelectric conversion layer PC3 is disposed between the third bottom electrode EB3 and the third top electrode ET3. Description of materials of the third bottom electrode EB3, the third photoelectric conversion layer PC3, and the third top electrode ET3 and relative arrangement relationships with other components may be found with reference to the description of the first bottom electrode EB1, the first photoelectric conversion layer PC1, and the first top electrode ET1, and such description is thus not repeated herein.

The third switch component SW3 is disposed on the third light sensing component LS3. Description of relative arrangement relationships, materials, etc. of film layers in the third switch component SW3 may be found with reference to FIG. 1 and the description of the first switch component SW1, and such description is thus not repeated herein. In some embodiments, as shown in FIG. 2 and FIG. 3, the first bottom electrode EB1 of the first light sensing component LS1 and the third bottom electrode EB3 of the third light sensing component LS3 may be separated from each other. That is, the first bottom electrode EB1 and the third bottom electrode EB3 are electrically insulated from each other.

The sensing panel 10 may further include a fourth pixel P4. The fourth pixel P4 is disposed on the substrate 100. The second pixel P2 and the fourth pixel P4 are arranged, for example, in the extending direction (e.g., the first direction D1) of the scan lines SL, and the third pixel P3 and the fourth pixel P4 are arranged, for example, in the extending direction (e.g., the second direction D2) of the data lines DL. The definition of the fourth pixel P4 is similar to the definition of the second pixel P2, and description thereof may be deduced by analogy.

The fourth pixel P4 may include a fourth light sensing component LS4 and a fourth switch component SW4. The fourth light sensing component LS4 may include a fourth bottom electrode EB4, a fourth photoelectric conversion layer PC4, and a fourth top electrode ET4. The fourth photoelectric conversion layer PC4 is disposed between the fourth bottom electrode EB4 and the fourth top electrode ET4. Description of materials of the fourth bottom electrode EB4, the fourth photoelectric conversion layer PC4, and the fourth top electrode ET4 and relative arrangement relationships with other components may be found with reference to the description of the first bottom electrode EB1, the first photoelectric conversion layer PC1, and the first top electrode ET1, and such description is thus not repeated herein.

The fourth switch component SW4 is disposed on the fourth light sensing component LS4. Description of relative arrangement relationships, materials, etc. of film layers in the fourth switch component SW4 may be found with reference to FIG. 1 and the description of the first switch component SW1, and such description is thus not repeated herein. In some embodiments, as shown in FIG. 2 and FIG. 3, the bias circuit BC may electrically connect the third bottom electrode EB3 of the third light sensing component LS3 and the fourth bottom electrode EB4 of the fourth light sensing component LS4. Moreover, the second bottom electrode EB2 of the second light sensing component LS2 and the fourth bottom electrode EB4 of the fourth light sensing component LS4 may be separated from each other. That is, the second bottom electrode EB2 and the fourth bottom electrode EB4 are electrically insulated from each other.

It should be understood that although in FIG. 2, the bottom electrodes in the pixels arranged in the second direction D2 are electrically connected through the bias circuit BC, for instance, the bias circuit BC may electrically connect the third bottom electrode EB3 of the third light sensing component LS3 and the fourth bottom electrode EB4 of the fourth light sensing component LS4, in other embodiments, the bottom electrodes in the pixels arranged in the first direction D1 may also be electrically connected through the bias circuit BC. As shown in FIG. 2, the bias circuit BC may electrically connect the first bottom electrode EB1 of the first light sensing component LS1 and the third bottom electrode EB3 of the third light sensing component LS3, but is not limited thereto. In another embodiment, the bottom electrodes in all pixels in the sensing panel 10 may be electrically connected through the bias circuit BC. As shown in FIG. 2, the first bottom electrode EB1 in the first pixel P1, the second bottom electrode EB2 in the second pixel P2, the third bottom electrode EB3 in the third pixel P3, and the fourth bottom electrode EB4 in the fourth pixel P4 may be electrically connected through the bias circuit BC.

It should be understood that although four pixels are schematically shown to be located in the sensing panel 10 in FIG. 2, the disclosure is not limited to four pixels, and the sensing panel 10 may include an array formed by arrangement of a plurality of pixels for image sensing.

According to different needs, the X-ray device 1 may further include other film layers. For instance, the X-ray device 1 may further include a packaging layer (not shown) and an adhesive layer. The packaging layer may be disposed on the scintillator layer 12 and covers the scintillator layer 12. The packaging layer may be a stack layer of one or a plurality of functional layers. For instance, the packaging layer may include a reflective layer and a water barrier layer. The reflective layer and the water barrier layer may be disposed on the scintillator layer 12 in sequence. In some embodiments, the adhesive layer may be disposed between the packaging layer and the scintillator layer 12. The packaging layer may be attached to the scintillator layer 12 through the adhesive layer. The reflective layer is suitable for allowing the X ray to pass through and reflecting visible light in the environment, for example. In this way, interference of visible light in the ambient light on a sensing result may be lowered through the reflective layer. Further, when the visible light generated by the scintillator layer 12 hits the reflective layer, the visible light may be reflected by the reflective layer and is transmitted towards the sensing panel 10, and sensing quality of the sensing panel 10 may thus be improved. The water barrier layer is suitable for reducing water vapor infiltration into the scintillator layer 12, may reduce the negative influence of water vapor on the scintillator layer 12, or may prolong the service life of the scintillator layer 12.

In some embodiments, the X-ray device 1 may further include a circuit board (not shown) electrically connected to the sensing panel 10 and a housing (not shown) accommodating the sensing panel 10, the scintillator layer 12, the packaging layer, and the circuit board.

Figure 5:
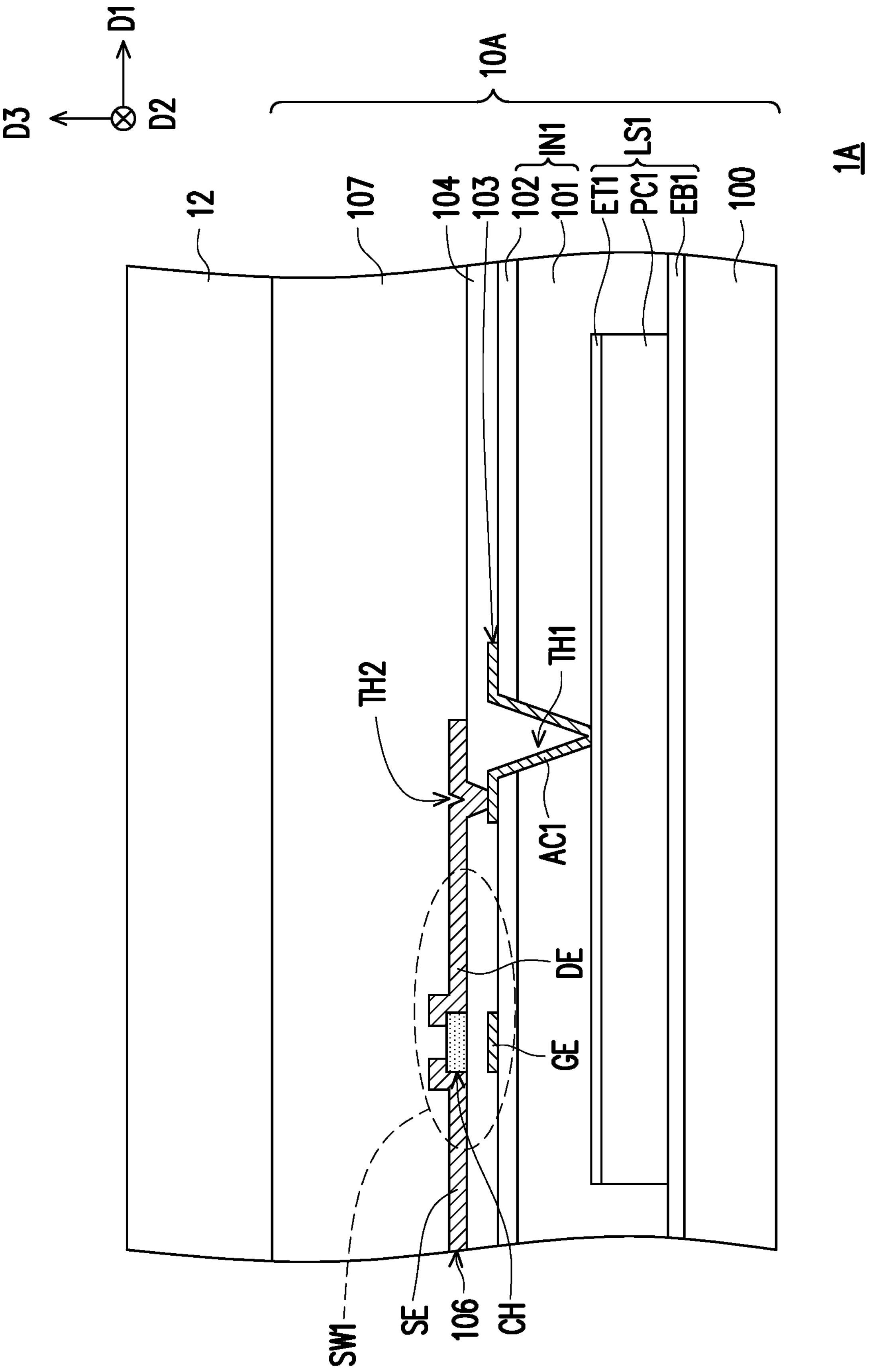
FIG. 5 is a schematic cross-sectional view of a local portion of an X-ray device according to a second embodiment of the disclosure.

FIG. 5 is a schematic cross-sectional view of a local portion of an X-ray device 1A according to a second embodiment of the disclosure. With reference to FIG. 5, a difference between the X-ray device 1A and the X-ray device 1 in FIG. 1 is that in a sensing panel 10A, the drain DE of the first switch component SW1 may contact the first reference circuit AC1. To be specific, the drain DE of the first switch component SW1 extends into the second through hole TH2 and contacts the first reference circuit AC1. In such a structure, the sensing panel 10A may not include the second reference circuit AC2 and the third insulating layer 108 in FIG. 1.

In view of the foregoing, in the embodiments of the disclosure, since the first switch component is disposed between the scintillator layer and the first light sensing component, the area of the photoelectric conversion layer in the first light sensing component is increased. Besides, a circuit (e.g., the bias circuit) located between adjacent two pixels may be disposed below the photoelectric conversion layers in the adjacent two pixels, and such circuit may thus be prevented from blocking photon absorption performed by the photoelectric conversion layers. In this way, the areas of the photoelectric conversion layers may be increased, or the photoelectric conversion layers may not be shielded, so that the fill factor is thereby enhanced. Alternatively, the image quality of the X-ray device provided by the embodiments of the disclosure may be improved.

The foregoing embodiments are merely described to illustrate the technical means of the disclosure and should not be construed as limitations of the disclosure. Even though the foregoing embodiments are referenced to provide detailed description of the disclosure, people having ordinary skill in the art should understand that various modifications and variations can be made to the technical means in the disclosed embodiments, or equivalent replacements may be made for part or all of the technical features. Nevertheless, it is intended that the modifications, variations, and replacements shall not make the nature of the technical means to depart from the scope of the technical means of the embodiments of the disclosure.

Although the embodiments of the disclosure and advantages thereof are disclosed as above, it should be understood that a person having ordinary skill in the art may make changes, substitutions, and modifications without departing from the spirit and scope of the disclosure. Further, the features between the embodiments may be randomly mixed and replaced to form other new embodiments. Moreover, the scope of the disclosure is not intended to be limited to the particular embodiments of the processes, machines, manufactures, compositions of matters, means, methods, and steps described in the specification. As a person having ordinary skill in the art will readily appreciate from the disclosure, the processes, machines, manufacture, compositions of matters, means, methods, or steps, presently existing or later to be developed, that perform substantially the same function or achieve substantially the same result as the corresponding embodiments described herein may be utilized according to the disclosure. Accordingly, the claims of the disclosure are intended to include within their scope of such processes, machines, manufacture, compositions of matter, means, methods, and/or steps. Further, each claim constitutes an individual embodiment, and the scope of the disclosure further covers a combination of each claim and the respective embodiment. The protection scope of the disclosure shall be defined by the appended claims.

What is claimed is:

1. An X-ray device, comprising:

a sensing panel, comprising:

a substrate; and a first pixel, disposed on the substrate, comprising:

a first light sensing component; and a first switch component, disposed on the first light sensing component, wherein the first switch component is a thin film transistor; and a scintillator layer, disposed on the sensing panel, wherein the first switch component is disposed between the scintillator layer and the first light sensing component, wherein a projection of a drain of the thin film transistor on the substrate is entirely located in a projection of the first light sensing component on the substrate.

2. The X-ray device according to claim 1, wherein the first light sensing component comprises:

a first bottom electrode, disposed on the substrate;

a first photoelectric conversion layer, disposed on the first bottom electrode; and a first top electrode, disposed on the first photoelectric conversion layer, wherein the first top electrode at least partially overlaps with the first bottom electrode in a normal direction of the substrate.

3. The X-ray device according to claim 2, wherein the first bottom electrode comprises a metal electrode.

4. The X-ray device according to claim 2, wherein the first top electrode comprises an indium tin oxide electrode.

5. The X-ray device according to claim 2, wherein the sensing panel further comprises:

a first insulating layer, disposed on the first light sensing component, having a first through hole, wherein the first through hole exposes the first top electrode;

a first reference circuit, disposed on the first insulating layer, electrically connected to the first top electrode through the first through hole;

a gate insulating layer, disposed on the first reference circuit and a gate of the thin film transistor, the gate insulating layer having a second through hole, wherein the second through hole exposes the first reference circuit, and the first reference circuit and the drain of the thin film transistor are electrically connected through the second through hole; and a second insulating layer, disposed on the thin film transistor.

6. The X-ray device according to claim 5, wherein the second insulating layer has a third through hole and a fourth through hole, the third through hole is connected to the second through hole, and the fourth through hole exposes the drain of the thin film transistor, the sensing panel further comprises:

a second reference circuit, disposed on the second insulating layer, extending into the second through hole, the third through hole, and the fourth through hole, wherein the first reference circuit and the drain of the thin film transistor are electrically connected through the second reference circuit.

7. The X-ray device according to claim 5, wherein the drain of the thin film transistor contacts the first reference circuit.

8. The X-ray device according to claim 2, wherein the sensing panel further comprises:

a plurality of scan lines, disposed on the substrate and extend in a first direction;

a plurality of data lines, disposed on the substrate and extend in a second direction, wherein the first direction is different from the second direction; and a second pixel, disposed on the substrate, wherein the first pixel and the second pixel are arranged in the second direction, and the second pixel comprises:

a second light sensing component, comprising a second bottom electrode, a second photoelectric conversion layer, and a second top electrode, wherein the second photoelectric conversion layer is disposed between the second bottom electrode and the second top electrode; and a second switch component, disposed on the second light sensing component; and a bias circuit, disposed on the substrate, disposed between the first pixel and the second pixel, wherein the bias circuit electrically connects the first bottom electrode of the first light sensing component and the second bottom electrode of the second light sensing component.

9. The X-ray device according to claim 8, wherein the bias circuit, the first bottom electrode of the first light sensing component, and the second bottom electrode of the second light sensing component belong to a same layer.

10. The X-ray device according to claim 8, wherein the sensing panel further comprises:

a third pixel, disposed on the substrate, wherein the first pixel and the third pixel are arranged in the first direction, and the third pixel comprises:

a third light sensing component, comprising a third bottom electrode, a third photoelectric conversion layer, and a third top electrode, wherein the third photoelectric conversion layer is disposed between the third bottom electrode and the third top electrode; and a third switch component, disposed on the third light sensing component, wherein the first bottom electrode of the first light sensing component and the third bottom electrode of the third light sensing component are electrically insulated from each other.

11. The X-ray device according to claim 8, wherein the bias circuit is disposed between the scan lines and the substrate.

12. The X-ray device according to claim 2, wherein an edge of the first photoelectric conversion layer is aligned with an edge of the first top electrode.

13. A sensing panel, suitable for an X-ray device, the sensing panel comprising:

a substrate;

a first pixel, disposed on the substrate, comprising:

a first light sensing component, comprising:

a first bottom electrode, disposed on the substrate;

a first photoelectric conversion layer, disposed on the first bottom electrode; and a first top electrode, disposed on the first photoelectric conversion layer; and a first switch component, disposed on the first light sensing component, wherein the first light sensing component is disposed between the first switch component and the substrate, the first bottom electrode comprises a metal electrode, and the first top electrode comprises a transparent electrode, wherein the first switch component is a thin film transistor; and a scintillator layer, wherein the first light sensing component is disposed between the substrate and the scintillator layer, wherein a projection of a drain of the thin film transistor on the substrate is entirely located in a projection of the first light sensing component on the substrate.

14. The sensing panel according to claim 13, wherein an edge of the first photoelectric conversion layer is aligned with an edge of the first top electrode.

15. The sensing panel according to claim 13, further comprising:

a first insulating layer, disposed on the first light sensing component, having a first through hole, wherein the first through hole exposes the first top electrode;

a first reference circuit, disposed on the first insulating layer, electrically connected to the first top electrode through the first through hole;

a gate insulating layer, disposed on the first reference circuit and a gate of the thin film transistor, the gate insulating layer having a second through hole, wherein the second through hole exposes the first reference circuit, and the first reference circuit and the drain of the thin film transistor are electrically connected through the second through hole; and a second insulating layer, disposed on the thin film transistor.

16. The sensing panel according to claim 15, wherein the second insulating layer has a third through hole and a fourth through hole, the third through hole is connected to the second through hole, and the fourth through hole exposes the drain of the thin film transistor, the sensing panel further comprises:

a second reference circuit, disposed on the second insulating layer, extending into the second through hole, the third through hole, and the fourth through hole, wherein the first reference circuit and the drain of the thin film transistor are electrically connected through the second reference circuit.

17. The sensing panel according to claim 15, wherein the drain of the thin film transistor contacts the first reference circuit.

18. The sensing panel according to claim 13, wherein the sensing panel further comprises:

a plurality of scan lines, disposed on the substrate and extend in a first direction;

a plurality of data lines, disposed on the substrate and extend in a second direction, wherein the first direction is different from the second direction; and a second pixel, disposed on the substrate, wherein the first pixel and the second pixel are arranged in the second direction, and the second pixel comprises:

a second light sensing component, comprising a second bottom electrode, a second photoelectric conversion layer, and a second top electrode, wherein the second photoelectric conversion layer is disposed between the second bottom electrode and the second top electrode; and a second switch component, disposed on the second light sensing component; and a bias circuit, disposed on the substrate, disposed between the first pixel and the second pixel, wherein the bias circuit electrically connects the first bottom electrode of the first light sensing component and the second bottom electrode of the second light sensing component.

19. The sensing panel according to claim 18, wherein the bias circuit, the first bottom electrode of the first light sensing component, and the second bottom electrode of the second light sensing component belong to a same layer.

20. The sensing panel according to claim 18, wherein the sensing panel further comprises:

a third pixel, disposed on the substrate, wherein the first pixel and the third pixel are arranged in the first direction, and the third pixel comprises:

a third light sensing component, comprising a third bottom electrode, a third photoelectric conversion layer, and a third top electrode, wherein the third photoelectric conversion layer is disposed between the third bottom electrode and the third top electrode; and a third switch component, disposed on the third light sensing component, wherein the first bottom electrode of the first light sensing component and the third bottom electrode of the third light sensing component are electrically insulated from each other.

* * * * *